United States Patent [19]

Milligan et al.

[11] 4,063,176

[45] Dec. 13, 1977

[54] BROADBAND HIGH FREQUENCY MIXER

[75] Inventors: Thomas A. Milligan, Littleton; Peter Will, Denver, both of Colo.

[73] Assignee: Vari-L Company, Inc., Denver, Colo.

[21] Appl. No.: 709,581

[22] Filed: July 29, 1976

[51] Int. Cl.$^2$ .......................... H04B 1/26; H03H 7/42
[52] U.S. Cl. .................................. 325/446; 325/449; 325/450; 333/26; 333/84 M
[58] Field of Search ............... 325/435, 437, 442, 445, 325/446, 449, 450; 321/69 W, 69 NL; 333/26, 84 M

[56] References Cited
U.S. PATENT DOCUMENTS 3,652,941  3/1972  Neuf .................................... 325/446

*Primary Examiner*—Robert L. Griffin
*Assistant Examiner*—Marc E. Bookbinder
*Attorney, Agent, or Firm*—Ancel W. Lewis, Jr.

[57] ABSTRACT

A broadband mixer has two separate tapered ground plane microstrip baluns associated with a first signal port and two separate tapered ground plane microstrip baluns associated with a second signal port together with a frequency converter or mixer portion coupled between the baluns associated with the first and second signal ports and a third signal port. The frequency converter or mixer portion is comprised of eight diodes in a double balanced bridge arrangement having two sets of terminals associated with the first and second signal ports, each of the terminals of said two sets being separated from each of the terminals of the third signal port by a diode to electrically isolate their respective signals. The baluns associated with the first and second signal ports provide for the transformation of unbalanced input signals to balanced signals at the frequency converting diodes. Another balun coupled between the diode bridge arrangement and the third signal port provides an unbalanced signal at the third signal port in response to balanced signals at the diodes from signal inputs at the first and second signal ports. The baluns associated with the first and second signal ports are cross-connected so that their respective signals do not pass through to the opposite signal port. The circuit is reversible in that a signal may be input to or output from any signal port.

16 Claims, 7 Drawing Figures

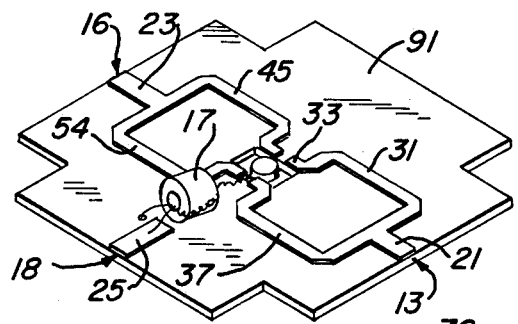
Fig_2
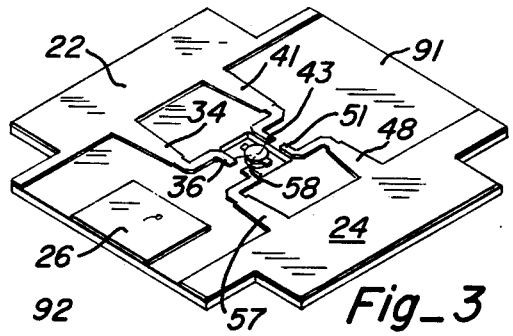
Fig_3
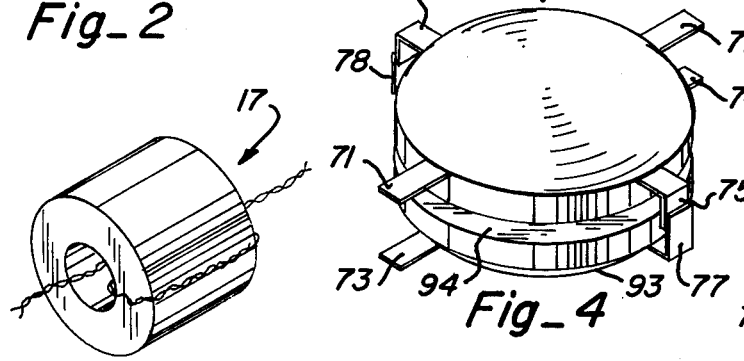
Fig_4
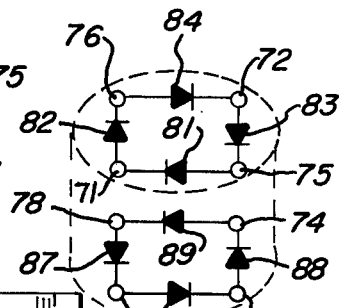
Fig_5
Fig_6
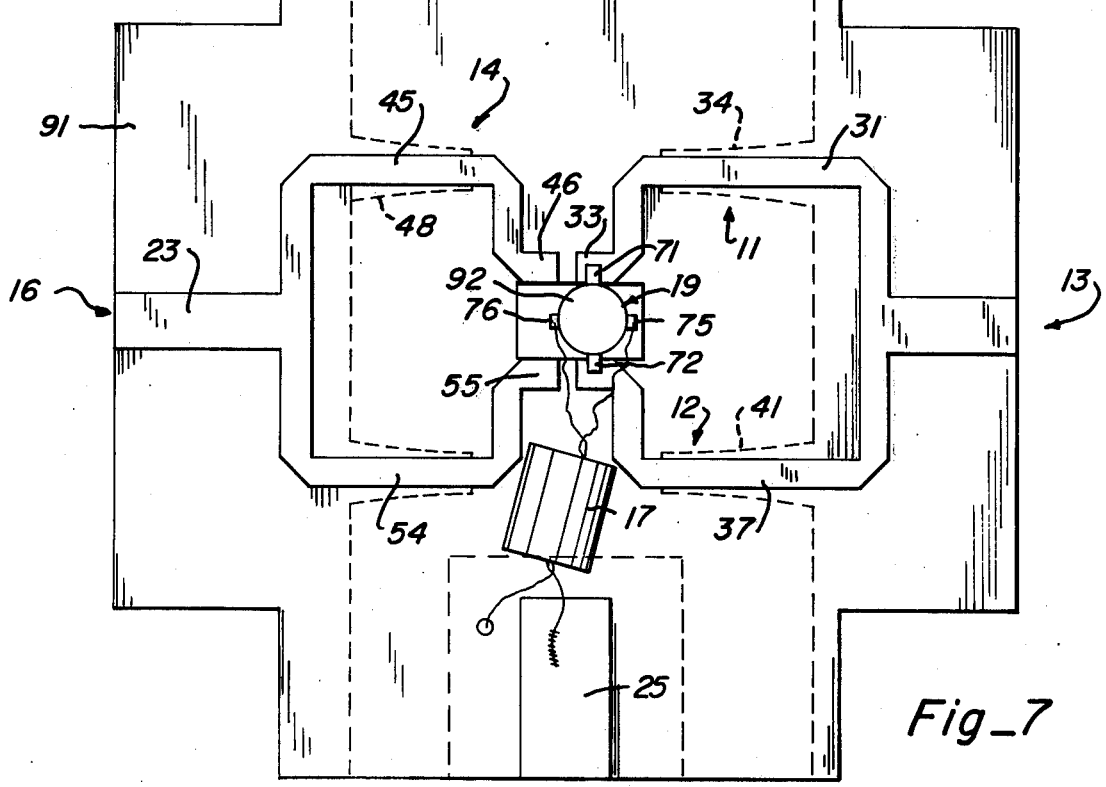
Fig_7

BROADBAND HIGH FREQUENCY MIXER

FIELD OF THE INVENTION

The present invention relates to mixer circuits for signals of a wide range of frequencies, which includes high radio frequencies in the VHF (30–400 MHz) and microwave (400–20,000 MHz) range, and more particularly to a novel broadband mixer suitable for communication, telemetry signal processing application, and the like.

DESCRIPTION OF THE PRIOR ART

Double balanced mixers heretofore provided for frequency applications have utilized four diodes in bridge or a ring configuration to convert signals from radio frequency such as 0.5–12 GHz to intermediate frequency ranges such as DC to 0.5 GHz using a local oscillator signal with a frequency range of 0.5–12 GHz. This single diode ring configuration, because of the required diode embedment, has been found to have a limited frequency response at the intermediate frequency signal port such as a response from DC to 0.5 GHz. The technique most commonly used in the past to obtain a wider response at the intermediate frequency signal port has been to insert frequency dependent components within the mixer structure, such as inductors, capacitors, etc., and this of course still results in a narrow IF signal port bandwidth and adds to the cost of manufacture and an increase in the size of the device.

Accordingly it is an object of the present invention to provide a novel broadband mixer that is compatible with signals at higher frequencies at the intermediate frequency signal port, radio frequency signal port and local oscillator signal port.

Another object of the present invention is to provide a novel broadband mixer having different signal ports for inputting and outputting different electric signals that have separate terminal pairs that are independent and electrically isolated from one another so that there is minimal signal interference between the several signal ports.

Yet a further object of the present invention is to provide a novel broadband mixer suitable for stepping up or stepping down signals over a wider bandwidth of frequencies and in which the signal ports may input or output signals for either stepping up or stepping down the frequency of an incoming signal.

Still a further object of this invention is to provide a novel mixer characterized by the use of tapered ground plane microstrip baluns coupled to each of the terminals of a local oscillator signal port and radio frequency signal port that convert an incoming unbalanced to ground signal to a balanced to ground signal and a frequency converter portion in the form of a double balanced bridge arrangement of eight diodes having two sets of terminals associated with both of said signal ports together with a balun associated with an intermediate frequency port that converts a balanced to ground intermediate frequency signal at the terminals of the converter diodes to an unbalanced to ground signal at the intermediate frequency signal port.

Another object of the present invention is to provide a novel mixer characterized by the use of two separate tapered ground plane microstrip baluns associated with each pair of terminals of radio frequency and local oscillator signal ports that are cross-connected with one another so that their respective signals do not pass through the opposite signal port.

Yet a further object of the present invention is to provide a novel mixer having a balanced to ground intermediate frequency signal at the frequency converting diodes and an unbalanced to ground intermediate frequency signal at the intermediate frequency signal port.

Other objects, advantages and capabilities of the present invention will become more apparent as the description proceeds taken in conjunction with the accompanying drawings, in which like parts have similar reference numbers and in which:

FIG. 2 is a top perspective view showing the construction of the broadband mixer of FIG. 1;

FIG. 3 is a bottom perspective view of the broadband mixer of FIG. 2;

FIG. 4 is a perspective view of two diode quads connected to one another;

FIG. 5 is a perspective view of the arrangement of the diodes in the two diode quad arrangement of FIG. 4;

FIG. 6 is a perspective view of a ferrite core balun; and

FIG. 7 is an enlarged top plan view of the mixer structure of FIGS. 2 and 3.

DESCRIPTION OF THE PREFERRED EMBODIMENTS

Figure 1:
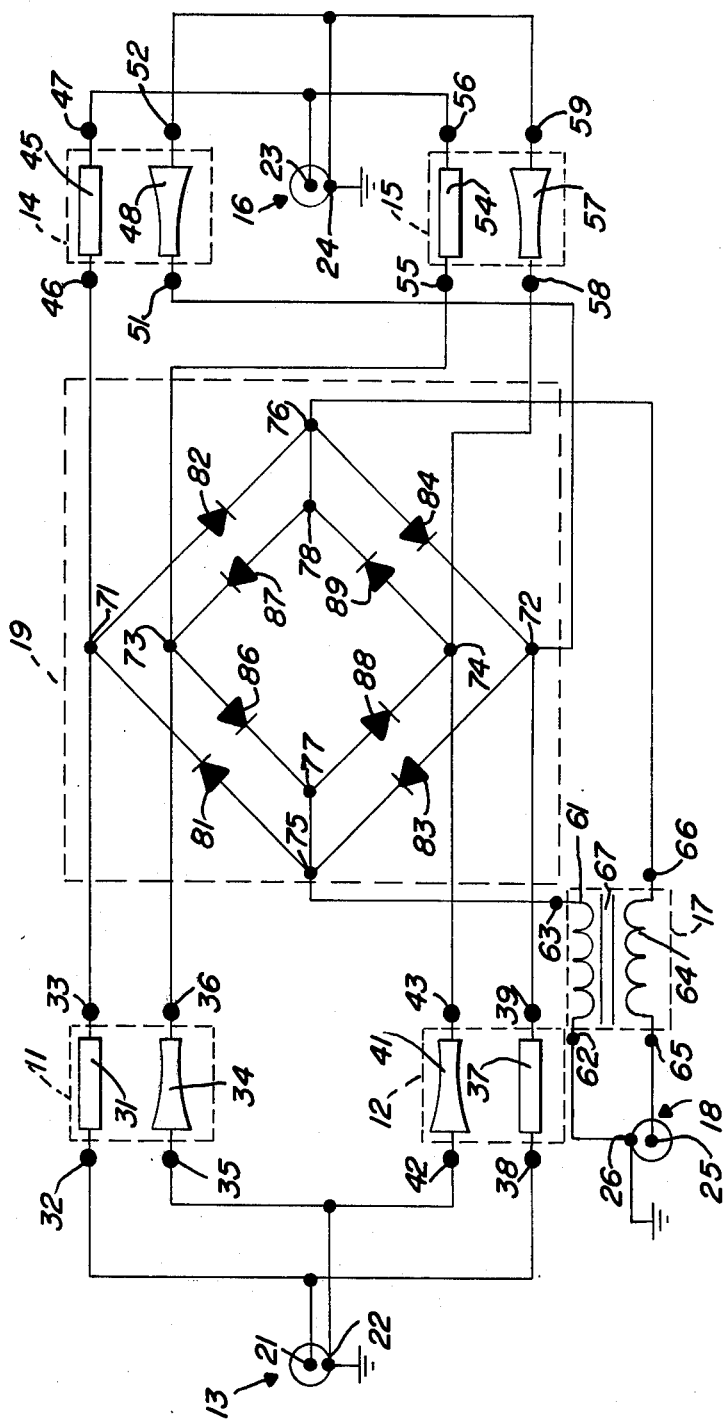
FIG. 1 is a schematic circuit diagram of a broadband mixer.

Referring now to FIG. 1 in the schematic diagram, there is shown a broadband mixer which in general comprises two baluns 11 and 12 associated with a signal port 13, two baluns 14 and 15 associated with a signal port 16, and a balun 17 associated with a signal port 18 together with a frequency converter generally designated by numeral 19 coupled between the baluns 11, 12, 13, 14, 15 and 17.

In the mixer circuit described herein, signal port 13 is suitable for operation in the frequency range of 0.5–12 GHz and for purposes of identification is herein referred to generally as the first signal port and is specifically referred to as the radio frequency or RF signal port because this signal port normally inputs or outputs a signal in the RF range. Signal port 16 is suitable for operation in the frequency range of 0.5 to 12 GHz and is generally herein referred to as the second signal port and specifically referred to as the local oscillator or LO signal port. Signal port 18 is suitable for operation in the frequency range of DC to 4 GHz and is herein referred to generally as the third signal port and specifically referred to as the intermediate frequency or IF signal port. These specific definitions for the three signal ports are those commonly used in the trade in mixer circuits and the like. All three signal ports, 13, 16 and 18 of the present invention are mutually interchangeable and may input or output a signal. Signal port 16 normally would have an input signal and signal ports 13 and 17 normally have a range of signals and may be used either to input or output a signal and to step up or step down the frequency of a signal, as described more fully hereinafter.

For purposes of identification and explanation of the mixer circuit, the RF signal port 13 is shown as having a pair of terminals 21 and 22, with terminal 22 being connected to ground, the LO signal port 16 is shown as having a pair of terminals 23 and 24 with terminal 24 being connected to ground and the IF signal port 18 has a pair of terminals 25 and 26 with terminal 26 connected to ground.

Each of the baluns 11, 12, 13 and 14 is of a similar construction and in the embodiment shown may be characterized as tapered ground plane microstrip transmission line balanced to unbalanced mode baluns. Balun 11 has a conductor 31 shown with terminals 32 and 33 at opposite ends thereof and a tapered ground plane 34 shown with terminals 35 and 36 at opposite ends thereof. Terminals 33 and 36 are a terminal pair on the side of the balun 11 opposite the RF signal port, and terminals 32 and 35 are a terminal pair on the RF signal port side of balun 11. Terminal 32 is connected by a line to terminal 21 of the RF signal port and terminal 35 is connected by a line to the terminal 22 of the RF signal port which is at ground so that the wide end of the tapered ground plane is connected to ground. When a signal is applied to RF signal port 13 there is an unbalanced signal with respect to ground at terminals 32 and 35. For one mode of operation wherein an RF signal is applied to the RF signal port 13, the terminal pair 32 and 35 are input terminals with an unbalanced input signal and terminals 33 and 36 the output terminals with a balanced to ground RF signal produced at terminals 33 and 36 as a result of the operation of the balun 11. However, since signals may input or output from each of the signal ports as discussed hereinafter, terminal pair 32 and 35 are input terminals for only one mode of operation wherein the signal applied at port 13 produces a signal at a lesser frequency at port 18.

Balun 12 has a conductor 37 shown with terminals 38 and 39 at opposite ends thereof and a tapered ground plane 41 shown with terminals 42 and 43 at opposite ends thereof. Terminals 39 and 43 are a terminal pair on the side of the balun opposite the RF signal port 13 and terminals 38 and 42 are a terminal pair on the RF signal port side. Terminal 38 is connected by a line to terminal 21 of the RF signal port and terminal 42 is connected by a line to terminal 22 of the RF signal port which is at ground to ground the wide end of the tapered ground plane 41 so that, when an RF signal is applied to the RF signal port, it is an unbalanced signal with respect to ground and the RF signals at terminals 39 and 43 resulting from an input to terminals 38 and 42 are balanced to ground RF signals.

Balun 14 has a conductor 45 with terminals 46 and 47 at opposite ends thereof and a tapered ground plane 48 with terminals 51 and 52 at opposite ends thereof. Terminals 47 and 52 then are a terminal pair on the LO signal port side of balun 14, and terminals 46 and 51 are a terminal pair on the side of balun 14 opposite the LO signal port. As a result of inputting a signal to signal port 16, the signal applied to terminals 47 and 52 is an unbalanced signal and the signal at terminals 46 and 51 is a balanced to ground signal. In turn, balun 15 has a conductor 54 with terminals 55 and 56 at opposite ends thereof and a tapered ground plane 57 with terminals 58 and 59 at opposite ends thereof. Terminals 56 and 59 are a terminal pair on the LO signal port side of balun 15, and terminals 55 and 58 are a terminal pair on the side of balun 15 opposite the LO signal port. Again with a signal applied to signal port 16, an unbalanced signal is applied to terminals 56 and 59 and a balanced to ground signal at terminals 55 and 58.

Balun 17 is in the form of a transformer and has a winding 61 with terminals 62 and 63 at opposite ends thereof and a winding 64 with terminals 65 and 66 at opposite ends thereof. Windings 61 and 64 are wound on a core 67 so as to be inductively coupled. Terminals 63 and 66 are a terminal pair on the side of the balun opposite the IF signal port 18 and terminals 62 and 65 are a terminal pair on the IF signal port side of balun 17.

Terminal 62 is connected by a line to terminal 26 of the IF port which is at ground to connect one terminal on the port side to ground, and terminal 65 is connected by a line to terminal 25 of the IF signal port 18. In this arrangement a balanced to ground IF signal is produced at terminals 63 and 66 and an unbalanced to ground IF signal is produced at terminals 62 and 65 of balun 18 which in turn are electrically connected to terminals 26 and 25, respectively, of the IF signal port 18.

The frequency converter 19, in general, is in the form of a double balanced bridge arrangement having two separate rings of matched diodes, there being an outer ring and an inner ring and four diodes per ring. This converter has what is referred to herein for reference purposes as a set of terminals 71 and 72, a set of terminals 73 and 74 or sets of terminals associated with the RF signal port and the LO signal port. The inner and outer rings are connected together at terminals shown schematically in FIG. 1 as two terminals 75 and 77 electrically connected by a line and two terminals 76 and 78 electrically connected by a line to correspond with the structure described hereinafter.

The outer ring of the frequency converter 19 includes a pair of matched non-linear devices in the form of diodes 81 and 82 between terminal 71 and terminals 75 and 76 and a pair of matched non-linear devices in the form of diodes 83 and 84 between terminal 72 and terminals 75 and 76. Diodes 81 and 83 form a series circuit between terminals 71 and 72 and are poled in the same direction. Diodes 82 and 84 form a series circuit between terminals 71 and 72 and are poled in the same direction between these terminals. These four diodes in the outer ring are poled in the same direction in a ring modulator arrangement and are referred to in the trade as a diode quad.

The inner ring of the frequency converter 19 further includes a pair of matched diodes 86 and 87 between terminal 73 and terminals 77 and 78 and a pair of matched diodes 88 and 89 between terminals 73 and 74 and terminals 77 and 78. Diodes 86 and 88 form a series circuit between terminals 73 and 74 and are poled in the same direction. Diodes 87 and 89 form a series circuit between terminals 73 and 74 and are poled in the same direction between these terminals. These four diodes 86, 87, 88 and 89 in the inner ring are poled in the same direction in a ring modulator arrangement or a diode quad.

It is noted that in this arrangement each of the terminals 71, 72, 73 and 74 is electrically isolated from each of the terminals 75, 76, 77 and 78 by at least one diode.

When balanced to ground signals are applied to the outer ring quad of matched diodes at terminals 71 and 72 from a signal being applied to the LO signal port, a virtual short is formed at terminals 75 and 76 by the symmetry of the diodes of the outer ring to the LO signal, thereby electrically isolating the LO signal from the IF port. Similarly, when balanced to ground signals are applied to the inner ring of matched diodes at terminals 73 and 74 from a signal applied to the LO signal port, a virtual short is formed at terminals 77 and 78 by the symmetry of the diodes of the outer ring to the LO signal, again electrically isolating the LO signal from the IF port.

In a like manner the balanced to ground signal at the terminals 71 and 73 resulting from an incoming RF signal is applied across a bridge comprised of diodes 81, 82, 86 and 87. Since diodes 81 and 82 are matched and diodes 86 and 87 are matched, then the bridge is balanced and terminals 77 and 78 are virtual shorts to the RF signals to electrically isolate the RF signal from the IF signal port. Similarly, the balanced to ground signal at terminals 72 and 74 is applied across diodes 83, 84, 88 and 89 and, since diodes 83 and 84 are matched and diodes 88 and 89 are matched, then again the terminals 77 and 78 are virtually shorts to the RF signal and the RF signal is isolated from the IF signal port.

The RF and LO ports 13 and 16 are electrically isolated from one another by the manner in which the terminal pairs opposite the signal port side are cross-connected. Specifically, terminals 33 and 36 of balun 11 are connected by separate lines to terminals 46 and 55, respectively, of baluns 14 and 15, and terminals 39 and 43 of balun 12 are connected by separate lines to terminals 51 and 58, respectively, of baluns 14 and 15. If, for example, a voltage of +2E were applied to the LO port 16, this voltage is divided and a +E voltage would appear at terminals 46 and 55 which are connected to terminals 33 and 36, respectively, placing a voltage of like amplitude and phase on terminal pairs 33 and 36 opposite the signal port side of balun 11. A −E voltage would appear at terminals 51 and 58 which are connected to terminals 39 and 43, respectively, also placing a voltage of like amplitude and phase on terminal pairs 39 and 43 opposite the signal port side of balun 12. In a like manner, when a voltage or signal is applied to RF signal port 13 these cross-connections place the proper signal on the terminal pairs of baluns 14 and 15 to prevent RF signals from appearing at the LO signal port. The application then of a signal of like polarity and amplitude to a pair of terminals on one side of the balun results in a canceling of the signals at the terminals on the opposite side or signal port side due to the operation of the balun.

Referring now to FIGS. 2-7, a structure shown for the broadband mixer above described includes a dielectric substrate or sheet 91 having the four conductors 31, 37, 45 and 54 made as a thin metal foil bonded on one side or face of the substrate, and four tapered ground planes 34, 41, 48 and 57 made as a thin metal foil on the opposite side or face thereof with the associated conductors and tapered ground planes of each balun being disposed directly opposite one another, i.e., conductor 31 opposite tapered ground plane 34 for balun 11, etc. The baluns common to a signal port such as baluns 11 and 12 are spaced apart sufficiently on the substrate 91 so they are separate and distinct and there is no interference between same.

Each of the conductors 31, 37, 45 and 54 has a uniform width and each of the tapered ground planes 34, 41, 48 and 57 is tapered to provide a balanced to unbalanced mode of operation. At the balanced end of the tapered ground planes the width of the conductor and the tapered ground plane is the same. From there on in the circuit to the diode terminals the widths are the same. The preferred method of making the taper is a Dolph-Tchebycheff taper. This taper in each tapered ground plane minimizes the reflected energy which appears in the even mode at the balanced output and is a high pass structure. For a given length of tapered ground plane the taper becomes effective above a lower cutoff frequency, and the reflected energy magnitude ripples with increasing frequency, such that all of the maximum ripple values are equal. Theoretically, this equal rippling has no upper frequency limit, but as a practical matter the upper operating frequency is limited only by the junction capacity of the diodes in the frequency converter 19.

The terminals 22, 24 and 26 are shown as relatively large, thin, metal foil strips constructed and formed like the balun conductors on the same side or face as the tapered ground plane conductors. The structure of the frequency converter or mixer portion 19 as shown in FIG. 4 comprises an upper diode quad having a cap-like body 92 with terminals 71, 72, 75 and 76 in the form of metal strips projecting radially out from the sides of the body 92 and containing the four diodes 81, 82, 83 and 84 as shown schematically in FIG. 5. A lower diode quad has a cap-like body 93 having terminals 73, 74, 77 and 78 in the form of metal conductive strips projecting radially out from the sides of the body 93. The strips 76 and 78 are bent into an overlapping relationship and suitably connected as by welding or soldering to make a common connection, and in a like manner strips 75 and 77 are bent into an overlapping relationship and are connected to make a common connection. This connection supports the two diodes in a spaced relationship as indicated by a gap 94. The balun transformer 17 is shown mounted on the face of the dielectric sheet 91 common to the conductors and is interconnected into the circuit components as shown by the schematic diagram of FIG. 1.

OPERATION

The operation of the mixer will now be described for a mode wherein an RF signal is applied to RF signal port 13 and converted or stepped down to an IF signal at the IF signal port 18. In addition to applying a signal to the RF signal port, a selected LO signal is applied to LO signal port 13, as is the usual practice with a mixer circuit. Because terminals 35, 42, 52 and 59 of their respective baluns are at ground, the signals input to each of these baluns are unbalanced to ground signals, and the signals at the terminals on the opposite side of the balun are balanced to ground. Each of the baluns 11, 12, 14 and 15 provides an output signal on the pair of terminals opposite the signal port side that is of equal amplitude, but 180° out of phase with one another. For example, the signal at terminal 36 has the same amplitude but is 180° out of phase with the signal at terminal 33. This results in the application of balanced to ground RF and LO signals to the terminals 71, 72, 73 and 74 of the double balanced bridge arrangement. This double balanced bridge arrangement, when driven by a sufficiently large local oscillator signal, allows a symmetrical bi-polar commutation of the RF signal to the terminals 75, 77, 78 and 76 which is still a balanced to ground IF signal at the diodes. Balun 17 provides an unbalanced IF signal at the terminals 25 and 26 of IF signal port 18. The balun 17 being of the ferrite core type extends the low frequency response.

The cross-connections of the terminals of baluns 11, 12, 14 and 15 opposite the signal port side of signal ports 13 and 16 prevent having the LO signals appearing at the RF signal port and the RF signals at the LO signal port.

From the foregoing it is apparent that the above mixer with two diode rings connected as shown provides separate terminal pairs for the RF and LO ports and a separate terminal pair for the IF port that are electrically isolated by the symmetry of the diode bridges, and this keeps currents of one port away from currents of the other port and allows a high frequency operation at the IF port as compared to other known mixers. For example, other mixer circuits normally operating in the range of 1 to 12 GHz have an IF signal port response of DC to 0.5 GHz whereas an IF signal port of the present invention has been found to have a good response between DC and about 4 GHz.

In addition, by the use of the tapered ground plane microstrip transmission line baluns shown and described, the frequency range is extended, and the use of two tapered baluns per RF port and two tapered baluns per LO port together with the eight diode arrangement has been found to provide a highly effective isolation of the RF and LO signals.

Although the present invention has been described with a certain degree of particularity, it is understood that the present disclosure has been made by way of example and that changes in details of structure may be made without departing from the spirit thereof.

What is claimed is:

1. A broadband mixer comprising:
   first balun means coupled to a first signal port for converting an unbalanced first signal applied to said first signal port to a balanced to ground first signal;
   second balun means coupled to a second signal port for converting an unbalanced second signal applied to said second signal port to a balanced to ground second signal, said first balun means being connected in a polarity relationship with said second balun means so that the balanced to ground signals of one of said first and second balun means do not pass to the signal port coupled to the other of said first and second balun means;
   third balun means coupled to a third signal port;
   frequency converting means having at least a first set of terminals and a second set of terminals to which are applied said balanced to ground first signal and said balanced to ground second signal, and a third set of terminals, said frequency converting means including an arrangement of non-linear devices associated with said first, second and third sets of terminals for converting said balanced to ground first and second signals to a balanced to ground third signal at said third set of terminals that is conducted via said third balun means to produce an unbalanced to ground third signal at said third signal port, said non-linear devices electrically isolating first and second signals at said first and second signal ports from said third signal port.

2. A broadband mixer as set forth in claim 1 wherein each of said first balun means and said second balun means are comprised of two tapered ground plane microstrip transmission line unbalanced to balanced mode baluns.

3. A broadband mixer as set forth in claim 2 wherein said first balun means includes a first balun having terminal pairs coupled between said first signal port and one of said first set of terminals and a second balun having terminal pairs coupled between said first signal port and another of said first set of terminals, said first and second baluns dividing an incoming first signal applied to said first signal port and providing a balanced to ground signal at associated terminal pairs of the first and second baluns opposite the first signal port that are in turn applied to said first and second set of terminals, said second balun means including a third balun having terminal pairs coupled between said second signal port and one of said second set of terminals and a fourth balun having terminal pairs coupled between said second signal port and the other of said second set of terminals, said third and fourth baluns dividing an incoming second signal applied to said second signal port and providing a balanced to ground signal at associated terminal pairs of the third and fourth baluns opposite the second signal port that are in turn applied to said first and second set of terminals.

4. A double balanced microwave mixer as set forth in claim 3 wherein each of said first, second, third and fourth baluns have a common dielectric substrate supporting a first conductor in the form of a conductive microstrip having a substantially constant width and a first tapered ground plane in the form of a conductive microstrip having a tapered width with a wide end and a narrow end, the associated conductors and tapered ground plane being disposed on opposite faces of said substrate directly opposite one another for each of said baluns.

5. A broadband mixer as set forth in claim 4 wherein said first conductor and said first tapered ground plane of said first balun are connected to the conductors of said third and fourth baluns to provide a signal of like amplitude and polarity on said first balun when the second signal is applied to said second signal port to isolate the second port from the first signal port and said first conductor and said first tapered ground plane of said second balun are connected to the tapered ground planes of said third and fourth baluns to provide a signal of like amplitude and polarity on said second balun when the second signal is applied to said second signal port to isolate signals between said second and said first signal ports.

6. A broadband mixer as set forth in claim 4 wherein said first and second baluns are arranged parallel to one another on said substrate and said third and fourth baluns are arranged parallel to one another on said substrate, said parallel baluns being separated a sufficient distance to avoid electrical interference with one another.

7. A broadband mixer as set forth in claim 1 wherein said frequency converting means includes a first pair of non-linear devices in the form of a first pair of matched diodes coupled between one of said first set of terminals and said third set of terminals and a second pair of non-linear devices in the form of a second pair of matched diodes coupled to the other of said first set of terminals and said third set of terminals, said first and second pairs of matched diodes being poled in the same direction in a first ring.

8. A broadband mixer as set forth in claim 7 wherein each of said first and second pairs of matched diodes are arranged as two series circuits of two diodes each between said first set of terminals and said third set of terminals, each diode in each of said series circuits being poled in the same direction for current flow in the same direction.

9. A broadband microwave mixer as set forth in claim 7 wherein said frequency converting means includes a third pair of matched diodes coupled between one of said second set of terminals and said third set of terminals and a fourth pair of matched diodes coupled to the other of said second set of terminals and said third set of terminals, said third and fourth pairs of matched diodes being poled in the same direction in a second ring.

10. A broadband mixer as set forth in claim 9 wherein each of said third and fourth pairs of matched diodes are arranged as two series circuits of two diodes each between said second set of terminals and said third set of terminals, each diode in each of said series circuits being poled in the same direction for circuit flow in the same direction.

11. A broadband microwave mixer as set forth in claim 1 wherein said third balun means associated with said third signal port includes a balun coupled between said third set of terminals and said third signal port converting a balanced to ground third signal at said third set of terminals to an unbalanced to ground third signal at said third signal port.

12. A double balanced microwave mixer as set forth in claim 11 wherein said balun is in the form of a transformer with a first winding connected between one of said third set of terminals and a first terminal of said third output port and a second winding connected between another of said third set of terminals and a second terminal of said third port.

13. A double balanced microwave mixer as set forth in claim 12 wherein said transformer is of the ferrite core type.

14. A broadband mixer as set forth in claim 1 wherein said frequency converting means is in the form of a first diode quad including a first body supporting four diodes connected to four terminals in the form of four conductive strips, and a second diode quad including a second body supporting four diodes connected to four terminals in the form of four conductive strips, two conductive strips of said first diode quad being bent to an overlapping relation with two conductive strips of said second diode quad to provide eight diodes connected in a double balanced bridge arrangement.

15. A broadband mixer comprising:
first balun means including a first microstrip balun and a second microstrip balun coupled to a first signal port for converting an unbalanced first signal applied to said first signal port to a balanced to ground first signal;
second balun means including a third microstrip balun and a fourth microstrip balun coupled to a second signal port for converting an unbalanced second signal applied to said second signal port to a balanced to ground second signal, said first balun means being connected in a polarity relationship with said second balun means so that the balanced to ground signals of one of said first and second balun means do not pass to the signal port coupled to the other of said first and second balun means;
third balun means coupled to a third signal port;
frequency converting means having at least a first set of terminals and a second set of terminals to which are applied said balanced to ground first signal and said balanced to ground second signal, and a third set of terminals, said frequency converting means including two separate rings of four diodes per ring, said rings being connected in a double bridge arrangement with said first, second and third sets of terminals for converting said balanced to ground first and second signals to a balanced to ground third signal at said third set of terminals that is conducted via said third balun means to produce an unbalanced to ground third signal at said third signal port, said diodes electrically isolating first and second signals at said first and second signal ports from said third signal port.

16. A broadband high frequency mixer comprising:
first and second unbalanced to balanced microstrip baluns coupled to a first signal port for converting a first input signal applied to said first signal port to a balanced to ground first signal;
third and fourth unbalanced to balanced microstrip baluns coupled to a second signal port for converting an incoming second signal to a balanced to ground second signal;
each said first, second, third and fourth baluns having a common dielectric substrate supporting a thin, flat conductor having a constant width and a tapered ground plane with a wide end and a narrow end;
each of said conductors and each of said tapered ground planes of said first, second, third and fourth baluns having a terminal at opposite ends thereof to provide a pair of terminals on a signal port side and a pair of terminals opposite the signal port side of each of said baluns;
the terminal connected to the wide end of the tapered ground plane being connected to ground and the other terminal of said pair being connected to an associated terminal of said first and second signal ports to provide a balanced to ground signal on the signal port side of each of said baluns;
the terminal pairs of said first, second, third and fourth baluns oppposite the port side being cross-connected to one another to apply signals of equal amplitude and phase to each pair of terminals opposite the port side of the baluns so that their respective input signals applied to said first signal port and said second signal port are electrically isolated from one another;
frequency converting means having a first set of terminals, a second set of terminals and a third set of terminals, said signal converting means including two pairs of matched diodes arranged in an outer ring and two pairs of matched diodes arranged as an inner ring and associated with said first, second, third and fourth baluns to short circuit said balanced to ground first signal and said balanced to ground second signal at said third set of terminals by the symmetry of the diodes in said outer ring and said inner ring to electrically isolate said first and second signals at said first and second signal ports from said third signal ports, each of said two pairs of matched diodes being coupled to said third set of terminals, each of said two pairs of matched diodes being arranged as two series circuits of two diodes each, each diode in each said series circuit being connected for current flow in the same direction;
a fifth unbalanced to balanced balun coupled to said third set of terminals for converting said balanced to ground third signal to an unbalanced to ground third signal at said third output port.

* * * * *